United States Patent [19]

Chin et al.

[11] Patent Number: 5,023,109
[45] Date of Patent: Jun. 11, 1991

[54] DEPOSITION OF SYNTHETIC DIAMONDS

[75] Inventors: Jack Chin, Carlsbad; Robert R. Goforth, Encinitas; Tihiro Ohkawa, La Jolla, all of Calif.

[73] Assignee: General Atomics, San Diego, Calif.

[21] Appl. No.: 403,284

[22] Filed: Sep. 6, 1989

[51] Int. Cl.$^5$ ............................................. C23C 16/48
[52] U.S. Cl. ................................... 427/45.1; 427/39; 156/613; 156/DIG. 68; 423/446; 118/723; 118/50.1
[58] Field of Search ............................. 118/723, 50.1; 427/45.1, 39, 446; 423/446; 156/613, DIG. 68

[56] References Cited

U.S. PATENT DOCUMENTS

| | | | |
|---|---|---|---|
| 4,434,188 | 2/1984 | Kamo et al. | 427/39 |
| 4,707,384 | 11/1987 | Schachner et al. | 427/249 |
| 4,728,529 | 3/1988 | Etzkorn et al. | 427/39 |
| 4,767,608 | 8/1988 | Matsumoto et al. | 423/446 |
| 4,816,286 | 3/1989 | Hirose | 427/39 |
| 4,851,254 | 7/1989 | Yamamoto et al. | 427/37 |

Primary Examiner—Richard Bueker
Attorney, Agent, or Firm—Fitch, Even, Tabin & Flannery

[57] ABSTRACT

Synthetic diamond crystals and films are deposited on a pair of uniformly spaced apart facing plates made of silicon, molybdenum or boron in elemental, nitride or carbide form. The plates are suitably supported within a totally thermally insulated chamber where a pressure of about 10 torr or less is maintained in the form of an atmosphere which includes a carbon source and a major portion of hydrogen, and preferably includes oxygen in equal amount to the carbon. By supplying sufficient microwave power to create a plasma and a uniform temperature of about 950° C. at the plate surfaces, diamond crystals economically grow on the surfaces of the facing plates. Preferably, either the plates or the backing sections thereof have a relatively high thermal conductivity so as to maintain a uniform temperature across the entire plate surface areas.

19 Claims, 1 Drawing Sheet

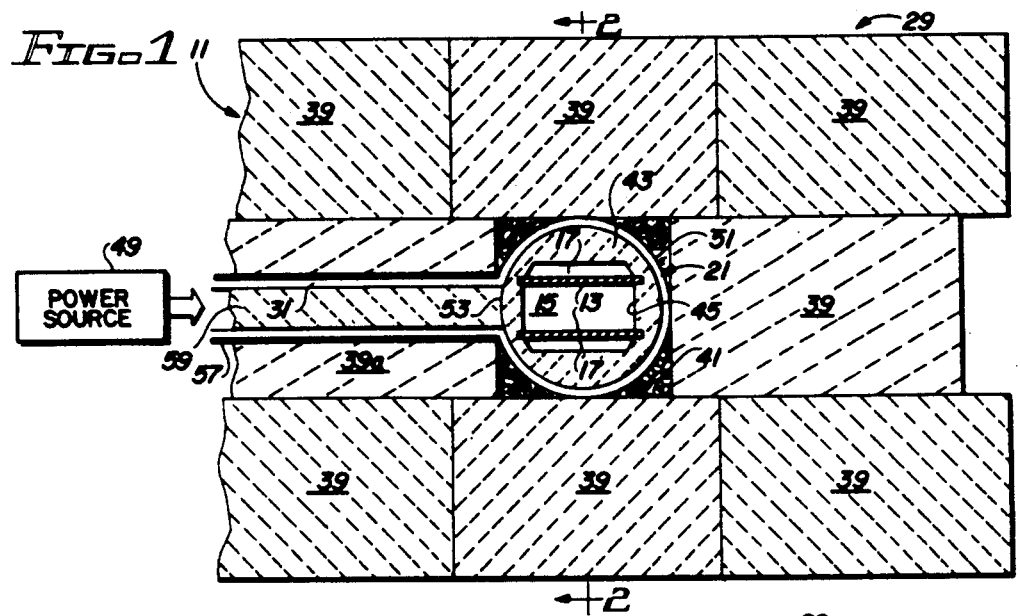
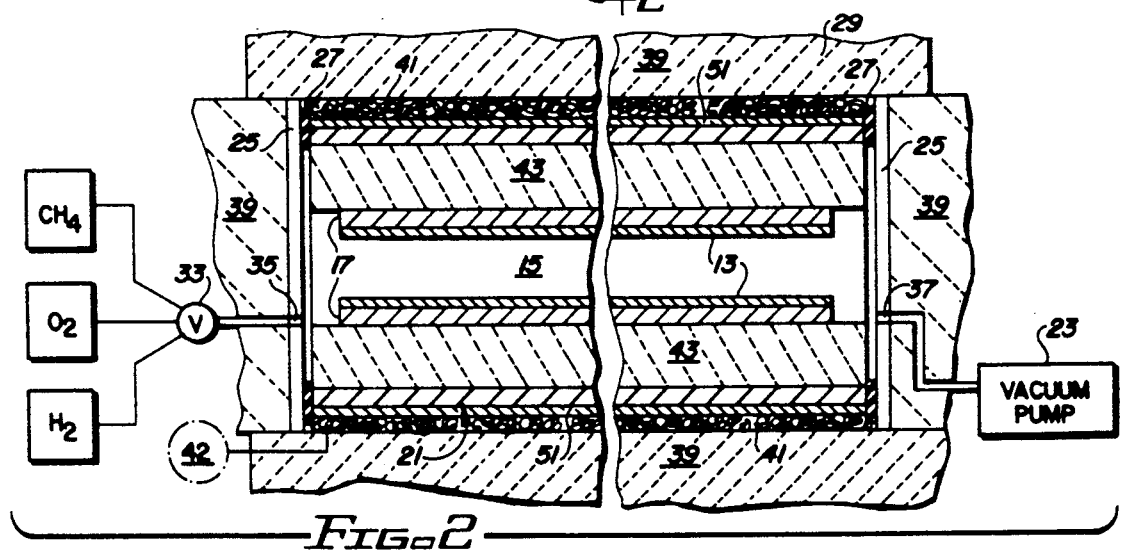
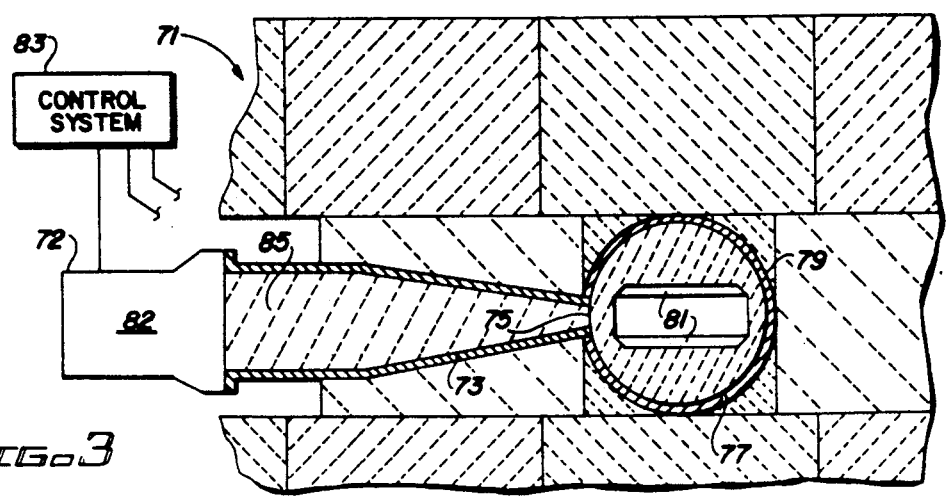

DEPOSITION OF SYNTHETIC DIAMONDS

This invention relates to the deposition of synthetic diamonds and, more particularly, to apparatus and methods for depositing a synthetic diamond film or crystals using chemical vapor deposition techniques and a plasma.

BACKGROUND OF THE INVENTION

During the past decade, considerable work has been done on producing synthetic diamonds by CVD (chemical vapor deposition) processes. U.S. Pat. No. 4,707,384 lists references to the substantial work of different parties which has been performed in this general area. U.S. Pat. No. 4,434,188 discloses the use of microwave energy to create a plasma for such a CVD diamond-forming method. Although the ground work has been done to show the feasibility of producing diamonds by such a CVD process, from a commercial standpoint, there remains much to be done to improve the economics of such a process, and work in this area continues to try to achieve such an aim.

SUMMARY OF THE INVENTION

The invention provides an improved process for CVD production of synthetic diamonds in crystal or film-like form by establishing a plasma region at a pressure of about 10 torr or less between a pair of facing plates, to which region there is supplied a gaseous mixture containing a major portion of hydrogen and a minor portion of a carbon source. By thermally insulating the region surrounding such plates, it is possible to maintain the front surfaces of the facing plates at a relatively uniform temperature within a desired temperature range which promotes the deposition of films of synthetic diamond crystals thereupon. This configuration has advantages relative to a single plate configuration in that a larger fraction of the plasma area is bounded by the substrate plate or plates. Relative to a plurality of plates, i.e., N plates, where N>2, this configuration has the advantage that the plates can be at the same temperature, without connecting them with high thermal conductivity material, whereas a multiple plate stack of N>2 plates tends to have a thermal gradient such that the individual plates will be at different temperatures. The absence of such metallic connections between the plates allows the plasma to be more easily formed. For example, microwaves can be used with the electric field vector being perpendicular to the major surface of the plate without substantial reflection of the microwaves. The plates preferably have front surfaces which are flat and are preferably made of a refractory metal or metalloid, e.g., silicon, molybdenum or boron in elemental, nitride or carbide form, although they may be made of other suitable refractory materials such as graphite, silica or alumina; these surfaces are preferably uniformly spaced apart a distance between about 4 mm. and about 4 cm. Each plate includes a backing section of a high thermal conductivity to further promote uniformity of temperature across the front surface of the plate.

In one embodiment, the apparatus includes a tubular chamber of generally circular cross-section with a pair of elongated flat plates arranged parallel to the centerline axis of the chamber and with a substantially void free silica insulation completely surrounding the pair of plates except for the void region therebetween. A microwave plasma generation arrangement is provided with a control system for maintaining a substantially uniform substrate temperature on the front surfaces of the plates, between about 925° C. and about 975° C. A waveguide for focusing microwave power can be disposed in surrounding relationship to the chamber in order to provide a peak electrical field along the axis thereof having electrical field vectors oriented normal to the front surfaces of the plates. In a preferred method of operation, the atmosphere which is supplied to the chamber contains approximately equal numbers of carbon atoms and oxygen atoms and a much larger number of hydrogen atoms. The carbon atoms can amount to up to about 10% or even 15% of total atoms; however, larger carbon fractions tend to give faster growth of diamond grains or film but create a less crystalline and more amorphous quality of diamond. The molecular species used to produce this atomic mixture may include alcohols, aldehydes, ketones, carbon dioxide, water, methane, acetylene, and ordinary air as well as many other similar compounds. In a preferred method of operation, the atmosphere contains 90% hydrogen, 5% methane, and 5% carbon dioxide by volume. Overall, it is presently preferred that a microwave plasma be produced in a relatively narrow channel, less than about 5 cm. thick, i.e. that which is defined by the elongated silicon, molybdenum or boron plates.

An object of the invention is to produce diamond crystals in substantial volume amounts using such plate-like substrates, and it has been found that this object can be achieved by maintaining a relatively large substrate surface area at a substantially uniform temperature, e.g., about 950° C.

BRIEF DESCRIPTION OF THE DRAWINGS

FIG. 1 is a diagrammatic view of a CVD apparatus for depositing synthetic diamond on substrates and is shown as a cross-section through the apparatus;

FIG. 2 is a sectional view of the apparatus of FIG. 1 taken, looking along line 2—2; and FIG. 3 is a fragmentary view, similar to FIG. 1, showing an alternative embodiment of apparatus for depositing synthetic diamond.

DETAILED DESCRIPTION OF THE PREFERRED EMBODIMENTS

The invention provides an apparatus 11 for producing synthetic diamond crystals in volume quantities on a plate-like substrate by employing a pair of facing elongated plates 13 that define a region 15 wherein a suitable plasma is maintained in a suitable low-pressure atmosphere. Uniformity of temperature across the substantial surface area is achieved by appropriately insulating the region which surrounds the plasma region and the plate arrangements. Moreover, to insure uniformity of surface temperature, either the plate material itself is chosen to have a relatively high thermal conductivity or the plates are provided with backing sections 17 made of a material having a high thermal conductivity.

As best seen in FIG. 1, the apparatus 11 includes a chamber 21 wherein the CVD process occurs and which can be evacuated to a relatively low pressure, for example to about 10 torr or less, by a suitable vacuum pump arrangement 23 as well known in this art. Typically, the chamber 21 can be a generally tubular quartz vacuum vessel which is circular in cross-section and which may have a length equal to between about five and about fifty times its diameter. Entry into the interior of the chamber 21 is provided through one of the two end closures 25, and suitable seals 27 are installed at each end (see FIG. 2). The chamber 21 is completely surrounded with thermal insulation 29, and a side channel 31 leading to the center portion of the chamber provides an entry for the high energy to create the plasma in the region 15. A suitable valve arrangement 33 which is connected to one or more supplies of different gases or vapors, such as hydrogen, argon, hydrocarbon, alcohol, etc., as described in more detail hereinafter delivers the gaseous atmosphere to be maintained within to one end of the region through an inlet conduit 35. Coordination of the setting of the valve arrangement and the vacuum pump arrangement 23, which connects to an outlet conduit 37 at the opposite end, allows maintenance of a continuous, slow flow of the desired low pressure atmosphere through the plasma region wherein the diamond production reaction occurs. As illustrated, the inlet 35 is on the opposite side of the chamber from the exit port 37 to which the vacuum pump arrangement is connected; the gas and/or vapor can also be supplied to the chamber through a plurality of ports spaced across the chamber so as to more evenly distribute the incoming atmosphere.

As best seen in FIG. 1, the apparatus locates the CVD chamber 21 within a surrounding array of high temperature insulating bricks 39 which totally surround the tubular chamber and, thus, effectively thermally isolate it from ambient temperature. By the use of silica bricks 39 or the like, which are resistant to a high temperature environment and which have a relatively low thermal conductivity, loss of heat by both radiation and thermal conduction is effectively minimized, and the temperature within the plasma region 15 can be closely controlled. The array of bricks is interrupted to leave a substantially parallelepiped central space within which the tubular CVD chamber 21 fits. To deter heat flow by convection from the chamber through this space, the peripheral or edge portions of this space are preferably filled with a fibrous thermal insulation, such as quartz wool 41 or the like; however, alternatively, a vacuum pump 42 (see FIG. 2) could be used to create a vacuum that would prevent heat convection in this space. Moreover, the establishment of such a thermally-insulating vacuum could be expanded and employed in lieu of some or all of the silica blocks 39. Disposed within the tubular chamber 21 is the plate assembly which provides the pair of facing plates 13 that define therebetween the plasma region 15. A cylindrical block 43 of silica is formed with a center void space or cavity 45 to accommodate the plate assembly. More specifically, this assembly includes a pair of plate subassemblies which are suitably supported within a central open region provided in the silica insulating block 43 as by mechanical interconnection to the block so that the facing surfaces of the two plates 13 flank the longitudinal centerline or axis of the tubular chamber 21.

As mentioned hereinbefore, the plate 13 facing surfaces should be formed of a material which is conducive to the high temperature plasma deposition of synthetic diamond, and preferred are plate surfaces made of silicon, molybdenum or boron, either in elemental or compound form, preferably nitride or carbide. Although these materials are preferred, other suitable refractory materials such as those disclosed in U.S. Pat. No. 4,707,384, the disclosure of which is incorporated herein by reference, e.g., alumina, may alternatively be used. Graphite may also be used as a plate surface material. For example, each plate subassembly may be a solid bar or rail of silicon carbide or of elemental molybdenum; however, composite plate subassemblies may also be used. In such a composite, it is contemplated that a surface or face section constituting the plate 13 is carried by a backing section 17 of relatively high thermal conductivity. The purpose of the backing section is not only to support the face section that serves as the substrate for the synthetic diamond deposition in the high temperature environment, but also to assure the effective spreading of the heat across the entire surface areas of the facing plates and, thus, minimize the creation of local hotspots and temperature gradients. As a result of this arrangement, the plates 13 are essentially thermally isolated from the remainder of the apparatus, and their temperature is closely controlled by radiative cooling. Because the overall high temperature insulation arrangement 29 created by the array of silica bricks 39 also minimizes heat transfer via radiation, electrical power is conserved while carrying out the CVD process.

A plasma is created in the region 15 between the two facing plates 13 by the influx of electrical energy from a suitable power source 49 which could be a direct current, alternating current, microwave or other plasma-generating electrical discharge arrangement adequate to create a plasma within a gaseous atmosphere of about 10 torr or less at relatively low voltages, e.g., 100 to 250 V., using high frequency excitation in the kilohertz to megahertz range, e.g., about 30 KHz to about 14 MHz. Such discharges between electrodes at opposite ends of the plasma region might be used; however, preferably microwave energy is used for it can be transmitted through thermal insulation material. To concentrate the wave form electrical energy within the plasma region 15, a suitable reflector material 51, such as nickel or a nickel alloy, e.g. Inconel, in the form of a suitable foil, covers the major portion of the exterior of the quartz chamber, except for the entrance 53 from the side passageway 31. Electrical energy is provided via an appropriate power source 49, such as a magnetron, and the incoming path of the electrical energy is via the side passageway 31. Accordingly, the side passageway is lined by foil 57 or the like. To accommodate the side passageway, custom insulating bricks 39a are provided having proportionally shaped openings to accommodate the foil 57. A suitable refractory plug 59 is preferably placed within the side passageway opening so as to minimize thermal losses outward from the chamber via the side passageway through which the electrical energy in wave form is being directed. The silica plug 59 is essentially transparent to short wave electrical energy and thus allows transmission of the electrical energy into the chamber through the side passageway and the wall of the quartz tube 21 that constitutes the chamber. As previously indicated, preferably substantially the entire region between the backing sections 17 and the interior surface of the quartz vessel is occupied with the thermal insulation provided by the hollow silica block 43, as best seen in FIG. 1, so that substantially only the plasma region 15 defined between the two facing plates is unoccupied.

The gas which is used for generation of the plasma should include a carbon source, preferably a hydrocarbon and a major portion of hydrogen, and it may also include some inert or noble gas, such as argon. Preferably hydrogen constitutes the major portion of the atmosphere, and the hydrogen can be supplied either as hydrogen gas or as a hydrocarbon, such as methane or acetylene, or as a combination of both. The hydrocarbon serves as the carbon source and also supplies part of the hydrogen. It is further found that good results are obtained when the atmosphere contains at least about ½%, by volume, of oxygen, and preferably oxygen is supplied in an atomic amount about equal to the carbon in the gaseous atmosphere. For example, carbon and oxygen may each constitute about 15% of the total atoms in the gaseous mixture with the remaining 70% being hydrogen. However, preferably carbon and oxygen do not each constitute more than about 10% of the total atoms, with the remainder being hydrogen or an inert gas, and more preferably oxygen and carbon each constitute about 5 atom % or less. Although oxygen gas can be supplied for this purpose, the optional oxygen content can also be supplied by using an organic alcohol, e.g., methanol, an aldehyde or a ketone which upon decomposition provides oxygen, hydrogen and carbon to the plasma; it and some carbon can also be supplied in the form of $CO_2$. As indicated, the individual components of the gaseous mixture are supplied at the desired ratios so as to create the desired relative volume percentages of the elements in the ultimate atmosphere, and the vacuum pump arrangement 23 is operated to maintain the pressure within the chamber at between about 1 torr and about 100 torr and preferably about 10 torr (10 mm. of Hg) or below. More preferably, the pressure is maintained between about 5 and about 10 torr and most preferably at about 5-6 torr.

Both the plate temperature and the intensity of the plasma within the region 15 between the plates 13 are maintained by the electrical wave energy, and sufficient energy is supplied by the power source 49 to maintain the plasma and to establish a uniform temperature of about 950° C. Although temperatures in the range of about 900° C. to about 1100° C. might be used, it is preferred that the target substrate temperature be between about 900° C. and about 1000° C. Preferably, the uniformity created by the overall arrangement is such that, when the target substrate temperature is 950° C., the temperature across the entire surface area of the facing plates is at least about 925° C. and does not exceed about 975° C. It is believed that maintenance of this uniformity of temperature in such a plasma region of this character efficiently and economically effects the deposition of synthetic diamond crystals across the entire surface areas of the facing plates 13 and that such can be efficiently established between two facing plates using microwave energy to create electric field vectors perpendicular to these surfaces of the plates.

Depicted in FIG. 3 is a diagrammatic representation of a similar apparatus 71 that is specifically designed to focus microwave energy from a microwave power source 72 toward the plasma region. In this arrangement, a copper waveguide feed 73 of inwardly tapering construction leads to a side entrance 75 into a tubular quartz vessel 77, the exterior surface of which vessel is either covered with suitable reflective material or surrounded by a suitable metallic waveguide applicator 79 designed to focus the microwave energy within the CVD chamber and provide a peak electric field on the centerline of the chamber between the pair of plate subassemblies 81. A suitable magnetron 82 serves as the power source 72 of microwave energy and is appropriately bolted or otherwise connected to the exterior end of the waveguide 73, and a control system 83, which monitors the temperature within the CVD chamber, is provided to control the power output of the magnetron 82. For example, a thermosensing arrangement can be provided so as to precisely measure the temperature within the plasma region of CVD chamber.

The tapered region within the copper waveguide 73 is preferably filled with a block 85 of silica thermal-insulating material, for silica has a low loss tangent for microwave absorption. Because microwave energy is being employed to create the plasma, preferably this thermal insulation (and all of the surrounding thermal insulation) is substantially free of any voids of 2 mm. or larger in size. Microwaves of about 300 MHz or above may generally be used; for example, microwaves in a frequency range at about 300 MHz to about 1000 GHz may be employed at an output of from about 300 W. to 5 KW. The feed waveguide 73 is constructed to be compatible with the frequency of the microwave power and direct it to the plasma region wherein it is focused, by the waveguide applicator 79, along the centerline of the quartz tube 77 so that the resulting electrical field vectors are oriented normal to the front facing surfaces of the flat plates.

As an example of one suitable apparatus, a quartz vessel 77 is provided having an outer diameter of about 8 cm. and a wall thickness of about 0.4 cm. The axial length of the quartz tube is about 50 cm., and accommodated therewithin are a pair of facing plates 81 each having a surface of about 6 cm.×40 cm. The thermal insulation is arranged so that at least 10 cm. of silica surrounds the entire plasma region. In this respect, the interior of the quartz vessel contains a silica block of insulation having a cavity shaped to accommodate the two plate subassemblies and space them from each other a distance of about 0.75 cm. All of the silica insulation is essentially void free, having no void greater than about 1 mm., and the thermal insulation quality of this material is such that it has a thermal conductivity measuring less than about 0.3 watts/$m^2$(°C/m). The copper feed waveguide 73 has a tapered structure, tapering from an exterior opening of about 1.5 cm. in height to an opening of about 0.75 cm. over a distance of about 10 cm. The length of the feed waveguide 73 (in the direction parallel to the axis of the quartz tube) is about equal to 80% of the length of the plates 81 upon which the diamond will be deposited; thus, the interior waveguide opening 75 has the dimension of about 0.75 cm.×32 cm. The applicator waveguide is copper about 0.3 cm thick. The plates each have an exposed surface formed of silicon carbide about 1 mm. thick, which has been bonded to or mounted in surface contact with a backing section in the form of a rail of copper about 0.6 cm. thick, having a relatively high thermal conductivity, i.e., about 300 watts per square meter(°K/meter). A gaseous mixture is fed into the chamber containing about 2 volume percent oxygen, about 4 volume percent methane and the remainder hydrogen. The vacuum pump is adjusted so as to maintain an atmosphere of about 5 torr within the quartz vessel. The magnetron is operated at an output power of about 3KW and a frequency of about 2.45 GHz, with the energy being directed by the feed waveguide into the central region within the quartz vessel where a plasma is created. The operation is carried out so that a target temperature of about 950° C. is maintained at the substrate surfaces, and through the placement of thermosensors across the surface of one of the plates, it is ascertained that the substrate surface temperature remains substantially uniform, varying less than 25° C. from the target temperature of 950° C. As a result, nucleation appears adjacent the surfaces, and synthetic diamonds slowly grow in a film-like form or as individual crystals on the surfaces of both plates. After operation for about 4 hours, the process is halted and the apparatus is allowed to cool to ambient conditions. Examination of the two plate subassemblies, following their removal from the quartz vessel, shows that synthetic diamonds have been created in the form of diamond grains of about 16 μm diameter.

Although the invention has been described with regard to the best mode presently contemplated by the inventors, it should be understood that various modifications and changes, as would be obvious to one having ordinary skill in this art, may be made without departing from the scope of the invention which is set forth in the claims appended hereto. For example, instead of using flat plates, a pair of plates having the same curvature could be employed so as to create a curved plasma region between a pair of uniformly spaced apart plates.

Particular features of the invention are emphasized in the claims which follow.

What is claimed is:

1. Apparatus for depositing a synthetic diamond film, which apparatus comprises
    a pair of facing plate means each having front and rear surfaces, said front surfaces being spaced apart from each other to define a region therebetween,
    means for maintaining a pressure of between about 1 torr and about 100 torr within said defined region,
    means for supplying a gaseous mixture containing a major portion of hydrogen and a minor portion of a carbon source to said defined region, and
    means for generating a plasma in said defined region in a manner so as to heat both said front plate surfaces to a relatively uniform temperature,
    surrounding region exterior of said plate means being thermally insulated to maintain said uniform temperature whereby the deposition of films of synthetic diamond crystals upon said front surfaces of plate means is promoted.

2. Apparatus in accordance with claim 1 wherein said front surfaces are substantially uniformly spaced apart a distance of between about 4 mm. and about 4 cm.

3. Apparatus in accordance with claim 1 wherein said plate means have relatively high thermal conductivity.

4. Apparatus in accordance with claim 1 wherein said plate means have front surfaces formed of a refractory metal or metalloid in elemental or compound form.

5. Apparatus in accordance with claim 3 wherein said front surfaces are formed of silicon, molybdenum or boron, or of a carbide or a nitride thereof.

6. Apparatus in accordance with claim 1 wherein said plate means includes a backing section means having a thermal conductivity of at least about 100 watts per m$^2$(°C/m).

7. Apparatus in accordance with claim 1 wherein said surrounding region contains thermal insulation in the form of ceramic material substantially free of voids of 2 mm. or larger.

8. Apparatus in accordance with claim 7 wherein said thermal insulation is silica.

9. Apparatus in accordance with claim 1 wherein said surrounding region is thermally insulated by vacuum-creating means which prevents heat-convection therethrough.

10. Apparatus in accordance with claim 1 wherein means is provided for controlling said plasma-generating means so that a substantially uniform substrate temperature between about 925° C. and about 975° C. is achieved across said front surfaces.

11. Apparatus in accordance with claim 1 wherein said plates means are substantially flat plates.

12. Apparatus in accordance with claim 11 wherein said flat plates are elongated in one direction and enclosed within a tubular chamber having an axis parallel to the planes of said plate means.

13. Apparatus in accordance with claim 12 wherein ceramic thermal insulation is provided which occupies substantially the entire region between said plate means and the interior surface of said tubular chamber.

14. Apparatus in accordance with claim 12 wherein said plasma-generating means is a microwave generator, wherein a waveguide for focusing microwave power is disposed in surrounding relationship to said tubular chamber and provides a peak electrical field along said axis of said chamber and wherein the electric field vectors which result therefrom are oriented normal to said front surfaces of said flat plates.

15. A method for depositing a synthetic diamond film, which method comprises
    providing a zone defined by a pair of facing plates having front surfaces which are spaced apart from each other,
    maintaining a pressure of between about 1 torr and about 100 torr within said zone,
    supplying a gaseous mixture containing a major portion of hydrogen and a minor portion of a carbon source to said zone,
    thermally insulating the region surrounding said zone and said plates, and
    generating a microwave plasma in said zone between said front plate surfaces in a manner to maintain both said front surfaces at relatively uniform temperatures, whereby the plasma causes deposition of films of synthetic diamond crystals upon said plate front surfaces.

16. A method in accordance with claim 15 wherein said zone is defined by said front surfaces which are substantially uniformly spaced apart a distance of between about 4 mm. and about 4 cm.

17. A method in accordance with claim 15 wherein said gaseous mixture contains about equal percentages of carbon and oxygen.

18. A method in accordance with claim 17 wherein said carbon source is a hydrocarbon.

19. A method in accordance with claim 15 wherein said plates are backed with sections having relatively high thermal conductivity to positively guard against thermal gradients along said plate surfaces.

* * * * *

UNITED STATES PATENT AND TRADEMARK OFFICE
CERTIFICATE OF CORRECTION

PATENT NO. : 5,023,109

DATED : June 11, 1991

INVENTOR(S) : Chin et al.

It is certified that error appears in the above-identified patent and that said Letters Patent is hereby corrected as shown below:

Column 4, line 64, after "hydrocarbon", insert a comma.

Column 7, line 37, before "surrounding", insert --the--.

Column 7, line 50, change "3" to --4--.

Signed and Sealed this

Fifteenth Day of December, 1992

Attest:

DOUGLAS B. COMER

*Attesting Officer*　　　*Acting Commissioner of Patents and Trademarks*